(12) United States Patent
Yamamoto

(10) Patent No.: US 10,389,386 B2
(45) Date of Patent: Aug. 20, 2019

(54) DATA PROCESSING APPARATUS, DATA PROCESSING METHOD, AND PROGRAM

(71) Applicant: Sony Corporation, Tokyo (JP)

(72) Inventor: Makiko Yamamoto, Tokyo (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 15/577,486

(22) PCT Filed: May 27, 2016

(86) PCT No.: PCT/JP2016/065679
§ 371 (c)(1),
(2) Date: Nov. 28, 2017

(87) PCT Pub. No.: WO2016/199595
PCT Pub. Date: Dec. 15, 2016

(65) Prior Publication Data
US 2018/0145704 A1 May 24, 2018

(30) Foreign Application Priority Data

Jun. 10, 2015 (JP) .................. 2015-117626

(51) Int. Cl.
*H04L 1/00* (2006.01)
*H03M 13/23* (2006.01)
(Continued)

(52) U.S. Cl.
CPC ........... *H03M 13/27* (2013.01); *H03M 13/23* (2013.01); *H03M 13/256* (2013.01);
(Continued)

(58) Field of Classification Search
CPC .... H03M 13/27; H03M 13/41; H03M 13/356; H03M 13/271; H03M 13/256;
(Continued)

(56) References Cited

U.S. PATENT DOCUMENTS

2013/0272451 A1* 10/2013 Lim ................. H04L 27/20
375/308
2015/0082131 A1* 3/2015 Jeong ................. H04L 1/0057
714/776
(Continued)

FOREIGN PATENT DOCUMENTS

JP 2013-005124 A 1/2013
WO 2014/177565 A1 11/2014

OTHER PUBLICATIONS

T. Shitomi et al., "Technology for the Next Generation of Digital Terrestrial Broadcasting : Improvement of Transmission Performance in Ultra Multi-level Signals Using Non-Uniform Mapping," NHK Science & Technology Research Laboratories, Japan, pp. 117-120, Jan. 30, 2014.
(Continued)

*Primary Examiner* — Cynthia Britt
(74) *Attorney, Agent, or Firm* — Michael Best & Friedrich LLP

(57) ABSTRACT

A data processing apparatus, a data processing method, and a program are disclosed. They improve communication performance by performing bit interleaving suitable for a modulation method that is a non-uniform constellation. One example of a data processing apparatus includes a mapping unit configured to generate a second bit sequence by mapping a first bit sequence to any symbol on a complex plane corresponding to a NUC modulation method, an inter-symbol interleaving unit configured to generate a third bit sequence by performing inter-symbol interleaving to the second bit sequence, an intra-symbol interleaving unit configured to generate a fourth bit sequence by performing intra-symbol interleaving for shifting M bits as a whole of the third bit sequence per a same number of M bits as the bit number M representing the symbol, and a modulation unit
(Continued)

configured to wirelessly transmit the fourth bit sequence according to the NUC modulation method.

10 Claims, 10 Drawing Sheets

(51) Int. Cl.
| | |
|---|---|
| H03M 13/27 | (2006.01) |
| H03M 13/25 | (2006.01) |
| H03M 13/35 | (2006.01) |
| H03M 13/41 | (2006.01) |
| H04L 27/36 | (2006.01) |
| H04L 27/34 | (2006.01) |

(52) U.S. Cl.
CPC ....... *H03M 13/271* (2013.01); *H03M 13/356* (2013.01); *H03M 13/41* (2013.01); *H04L 1/00* (2013.01); *H04L 1/0071* (2013.01); *H04L 27/3494* (2013.01); *H04L 27/36* (2013.01)

(58) Field of Classification Search
CPC ........ H03M 13/23; H04L 1/0071; H04L 1/00; H04L 27/3494; H04L 27/36
See application file for complete search history.

(56) References Cited

U.S. PATENT DOCUMENTS

| | | | |
|---|---|---|---|
| 2015/0089321 A1* | 3/2015 | Myung | H03M 13/036 714/758 |
| 2015/0163085 A1* | 6/2015 | Stadelmeier | H03M 13/356 375/298 |
| 2016/0149589 A1* | 5/2016 | Ikegaya | H03M 13/1105 714/758 |

OTHER PUBLICATIONS

J. Zoellner, et al., "Optimization of High-order Non-uniform QAM Constellations," 2013 IEEE International Symposium on Broadband Multimedia Systems and Broadcasting (BMSB), London, pp. 1-6, Jun. 5-7, 2013.

J. Morgade et al., "Improving the DVB-T2 BICM Performance by Newly Optimized Two-Dimensional Non-Uniform Constellations," 2014 IEEE Fourth International Conference on Consumer Electronics Berlin (ICCE-Berlin), pp. 96-100, Sep. 1-10, 2014.

* cited by examiner

DATA PROCESSING APPARATUS, DATA PROCESSING METHOD, AND PROGRAM

TECHNICAL FIELD

The present disclosure relates to a data processing apparatus, a data processing method, and a program, and particularly relates to a data processing apparatus, a data processing method, and a program that perform bit interleaving suitable for the case in which a modulation method of wireless transmission is a NUC (non-uniform constellation).

BACKGROUND ART

For example, in IEEE802.11 of a wireless LAN standard, it is defined that bit interleaving is performed on a bit sequence obtained by mapping to a complex plane according to a convolution coding and a modulation method in order to increase error resistance.

The bit interleaving includes inter-symbol interleaving for spreading a burst error in a viterbi decoding on a receiving side and intra-symbol interleaving for spreading robustness in one symbol.

FIG. 1 illustrates an overview of inter-symbol interleaving. In the inter-symbol interleaving, processing is performed in which a bit sequence is written longitudinally in a storage area of a memory by a predetermined number of bits (in the case of FIG. 1, 16 bits), and the written bit sequence is read out transversely by a predetermined number of bits (in the case of FIG. 1, $N_{CBPS}/16$ bits, $N_{CBPS}$ is the number of a coding bit per one symbol).

In the intra-symbol interleaving, processing is performed in which the bit sequence read out transversely from the memory is shifted in the symbol per one symbol so as to distribute strong and weak positions in robustness of each bit. The intra-symbol interleaving is specifically described.

FIG. 2 illustrates a signal space diagram of a 64QAM modulation method (hereinafter, referred to simply as 64QAM) employed in IEEE802.11ac.

64QAM is a uniform constellation in which 64 signal points are disposed so that the distances between signal points on a complex plane become equal. As for 64QAM, one symbol representing a position of the signal point includes 6 bits.

FIG. 3 illustrates each robustness of 6 bits constituting one symbol of 64QAM. In the case of 64QAM, the robustness of each bit has three phases. In specific, the 0th bit (MSB) and the third bit from a left side of the 6 bits are the strongest, the first bit and the fourth bit from the left side of the 6 bits are the second strongest, and the second bit and the fifth bit (LSB) from the left side of the 6 bits are the weakest.

FIG. 4 illustrates an overview of intra-symbol interleaving corresponding to 64QAM. In the case of QAM, a bit sequence of S bit is shifted per S bit (in the case of 64QAM, 3 bits) of half of the number of bits constituting one symbol according to the row of the memory from which the bit sequence has been read out.

In specific, the bit sequence corresponding to one symbol read out from the 0th row is shifted to the left side by 0 digit per 3 bits (that is, it is not shifted). The bit sequence corresponding to one symbol read out from the first row is shifted to the left side by 1 digit per 3 bits. The bit sequence corresponding to one symbol read out from the second row is shifted to the left side by 2 digits per 3 bits. The bit sequence corresponding to one symbol read out from the third row is shifted to the left side by 3 digits per 3 bits (that is, it is not shifted similar to that in the 0th row). The bit sequence corresponding to one symbol read out from the fourth row is shifted to the left side by 4 digits per 3 bits (that is, it is shifted to the left side by 1 digit per 3 bits, similar to that in the first row). In this manner, in the intra-symbol interleaving corresponding to 64QAM, one symbol is divided per 3 bits, and is shifted in a three-row cycle.

It is assumed that for the above-described intra-symbol interleaving, the employed modulation method is the uniform constellation such as 64QAM.

Incidentally, in these days, in order to perform more efficient wireless communication, the modulation method such as 64NUC (non-uniform constellation) has been proposed in which signal points are disposed at positions where the distances between signal points on a complex plane are not equal (for example, see PTL 1).

CITATION LIST

Patent Literature

[PTL 1]
WO/2014/177565

SUMMARY

Technical Problem

Currently, intra-symbol interleaving has not been proposed which is suitable for a case in which a modulation method is a non-uniform constellation such as 64NUC.

The present disclosure has been made in the light of such a situation, and is to improve communication performance by performing the bit interleaving suitable for the modulation method that is the non-uniform constellation.

Solution to Problem

A data processing apparatus in one aspect of the present disclosure includes a mapping unit configured to generate a second bit sequence by mapping a first bit sequence to any symbol on a complex plane corresponding to a NUC modulation method, an inter-symbol interleaving unit configured to generate a third bit sequence by performing inter-symbol interleaving to the second bit sequence, an intra-symbol interleaving unit configured to generate a fourth bit sequence by performing intra-symbol interleaving for shifting M bits as a whole of the third bit sequence per a same number of M bits as the bit number M representing the symbol, and a modulation unit configured to wirelessly transmit the fourth bit sequence according to the NUC modulation method.

The inter-symbol interleaving unit can generate the third bit sequence by writing vertically the second bit sequence to a memory and reading transversely the second bit sequence from the memory. The intra-symbol interleaving unit can shift the M bits as a whole of the third bit sequence by a digit according to a row read transversely from the memory per the same number of M bits as the bit number M representing the symbol.

The intra-symbol interleaving unit can shift 6 bits as a whole of the third bit sequence per the 6 bits by the digit according to the row read transversely from the memory, if the NUC modulation method is 64NUC.

The data processing apparatus in one aspect of the present disclosure can further include a conversion unit configured to convert a signal of a transmission target into the first bit sequence.

A data processing method in one aspect of the present disclosure includes, in the data processing method for the data processing apparatus, by the data processing apparatus, a mapping step of generating a second bit sequence by mapping a first bit sequence to any symbol on a complex plane corresponding to a NUC modulation method, an inter-symbol interleaving step of generating a third bit sequence by performing inter-symbol interleaving to the second bit sequence, an intra-symbol interleaving step of generating a fourth bit sequence by performing intra-symbol interleaving for shifting M bits as a whole of the third bit sequence per a same number of M bits as the bit number M representing the symbol, and a modulation step of wirelessly transmitting the fourth bit sequence according to the NUC modulation method.

A program in one aspect of the present disclosure causes a computer to function as: a mapping unit configured to generate a second bit sequence by mapping a first bit sequence to any symbol on a complex plane corresponding to a NUC modulation method, an inter-symbol interleaving unit configured to generate a third bit sequence by performing inter-symbol interleaving to the second bit sequence, an intra-symbol interleaving unit configured to generate a fourth bit sequence by performing intra-symbol interleaving for shifting M bits as a whole of the third bit sequence per a same number of M bits as the bit number M representing the symbol, and a modulation unit configured to wirelessly transmit the fourth bit sequence according to the NUC modulation method.

In one aspect of the present disclosure, the second bit sequence is generated by mapping the first bit sequence to any symbol on the complex plane corresponding to the NUC modulation method, the third bit sequence is generated by performing the inter-symbol interleaving on the second bit sequence, the fourth bit sequence is generated by performing the intra-symbol interleaving for shifting the M bits as a whole of the third bit sequence per the same number of M bits as the bit number M representing the symbol, and the fourth bit sequence is wirelessly transmitted according to the NUC modulation method.

Advantageous Effect of Invention

According to one aspect of the present disclosure, it is possible to improve communication performance, by performing bit interleaving suitable for a NUC modulation method.

DESCRIPTION OF EMBODIMENT

Hereinafter, the best mode for implementing the present disclosure (hereinafter, referred to as an embodiment) is described in detail with reference to drawings.

<64NUC>

First, 64NUC employed by the data processing apparatus in the embodiment of the present disclosure as wireless communication, is described.

Figure 5:
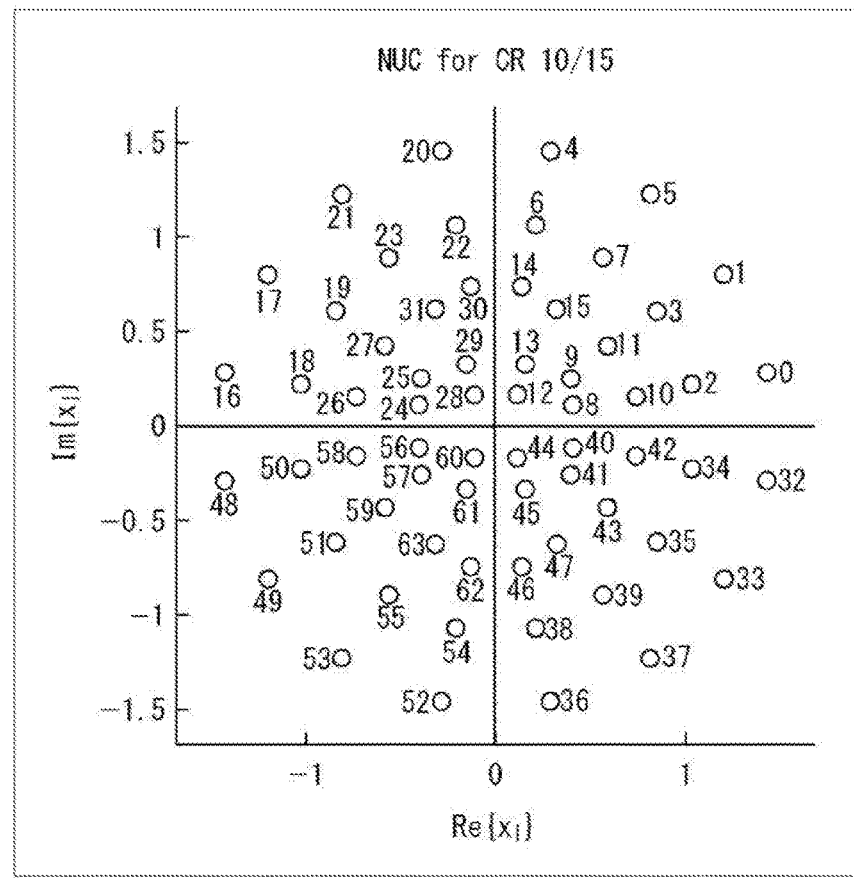
FIG. 5 is a view illustrating a signal space diagram of 64NUC.

FIG. 5 illustrates a signal space diagram corresponding to 64NUC. 64NUC is a non-uniform constellation in which 64 signal points are disposed at positions where distances between the signal points on a complex plane are not equal. One symbol representing the position of the signal point includes 6 bits.

Figure 6:
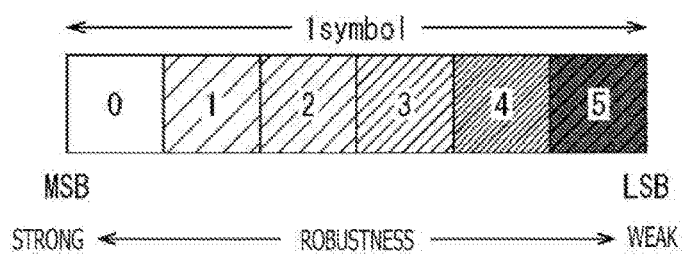
FIG. 6 is a view illustrating robustness of each bit constituting one symbol of 64NUC.

FIG. 6 illustrates robustness of each bit including one symbol of 64NUC. In the case of 64NUC, the robustness of bits has six phases. In specific, the robustness of the 0th bit (MSB) from a left side of the 6 bits is the strongest, the robustness is gradually lower toward the fifth bit (LSB) therefrom, and LSB has the characteristics of the weakest robustness.

Figure 7:
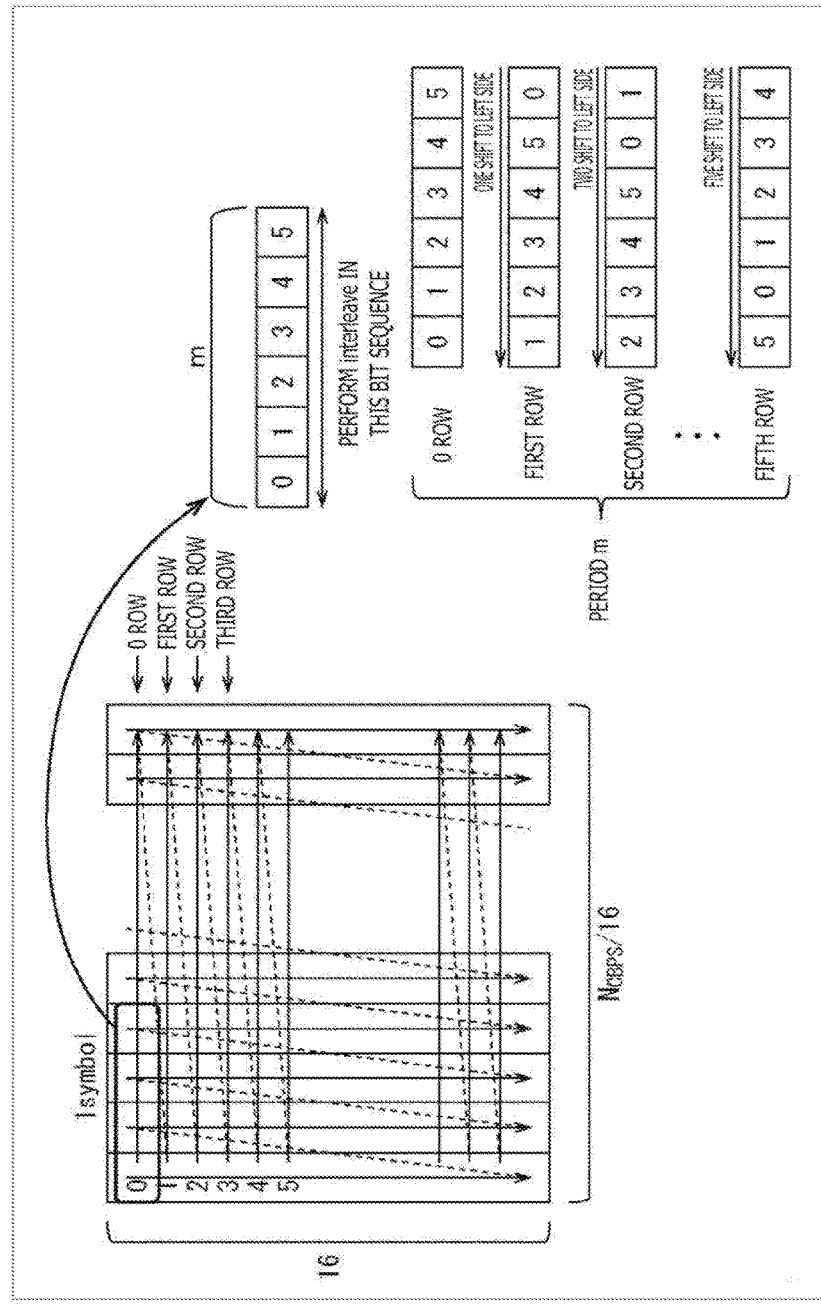
FIG. 7 is a view illustrating an overview of inter-symbol interleaving corresponding to 64NUC.

FIG. 7 illustrates an overview of intra-symbol interleaving corresponding to 64NUC.

In the case of NUC, the bit sequence is shifted according to the row of the memory from which the bit sequence has been read out per the bit number m (in this case, i.e. in the case of 64NUC, 6 bits) constituting one symbol in the bit sequence read out transversely from the memory in the preceding inter-symbol interleaving.

In specific, the bit sequence corresponding to one symbol read out from the 0th row is shifted to the left side by 0 digit (that is, it is not shifted). The bit sequence corresponding to one symbol read out from the first row is shifted to the left side by 1 digit. The bit sequences corresponding to one symbol read out from the second row are each shifted to the left side by 2 digits. Similarly, the bit sequence corresponding to one symbol read out from the third row to the fifth row is shifted to the left side by 3 to 5 digits. The bit sequence corresponding to one symbol read out from the sixth row is shifted to the left side by 6 digits (that is, it is not shifted similar to that in the 0th row). The bit sequence corresponding to one symbol read from the seventh row is shifted to the left side by 7 digits (that is, it is shifted to the left side by 1 digit, similar to that in the first row). In this manner, in the intra-symbol interleaving corresponding to 64NUC, one symbol is shifted in a six-row cycle.

<Configuration Example of Data Processing Apparatus in Embodiment of Present Disclosure>

Figure 8:
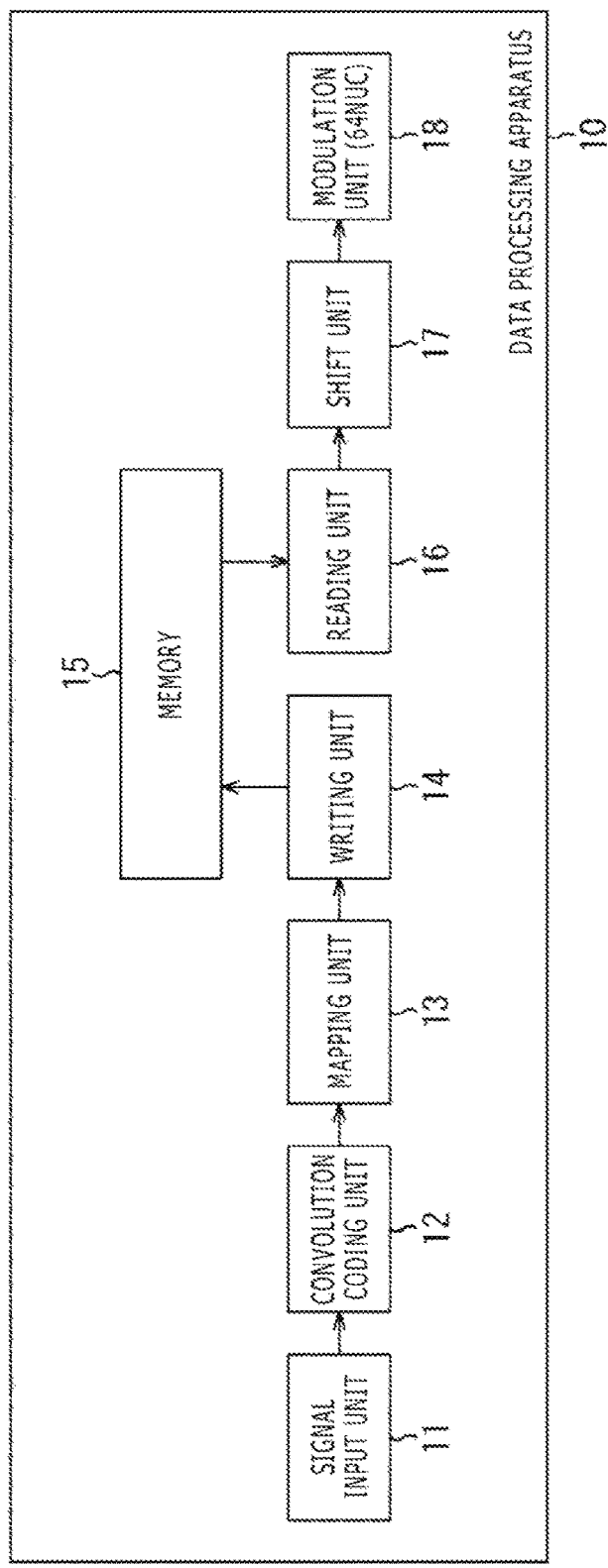
FIG. 8 is a block diagram illustrating a configuration example of a data processing apparatus to which the present disclosure is applied.

Next, FIG. 8 illustrates a configuration example of the data processing apparatus in the embodiment of the present disclosure.

The data processing apparatus 10 performs wireless communication according to 64NUC. The data processing apparatus 10 includes a signal input unit 11, a convolution coding unit 12, a mapping unit 13, a writing unit 14, a memory 15, a reading unit 16, a shift unit 17, and a modulation unit 18.

The signal input unit 11 acquires a signal of a transmission target and then outputs the signal to the subsequent stage. The convolution coding unit 12 performs convolution coding on the signal input. The mapping unit 13 maps coded data to be obtained as a result of the convolution coding to any of signal points on a complex plane corresponding to the modulation method (in this case, 64NUC) employed in the modulation unit 18 at the subsequent stage.

The writing unit 14 writes longitudinally the bit sequence representing the signal point (symbol) mapped to the point in the storage area of the memory 15 by a predetermined number of bits (in this case, 16 bits). The reading unit 16 performs the inter-symbol interleaving by reading out transversely the bit sequence to be written longitudinally in the storage area of the memory 15 by a predetermined number of bits (in this case, $N_{CBPS}/16$ bits).

The shift unit 17 performs the intra-symbol interleaving for the bit sequence read out on which the inter-symbol interleaving has been performed by shifting the bit sequence in the symbol per 6 bits of one symbol according to the row of the memory 15 from which the bit sequence has been read out as illustrated in FIG. 7. The modulation unit 18 performs the wireless transmission for the bit sequence on which the bit interleaving has been performed according to the 64NUC.

<Transmission Processing by Data Processing Apparatus 10>

Figure 9:
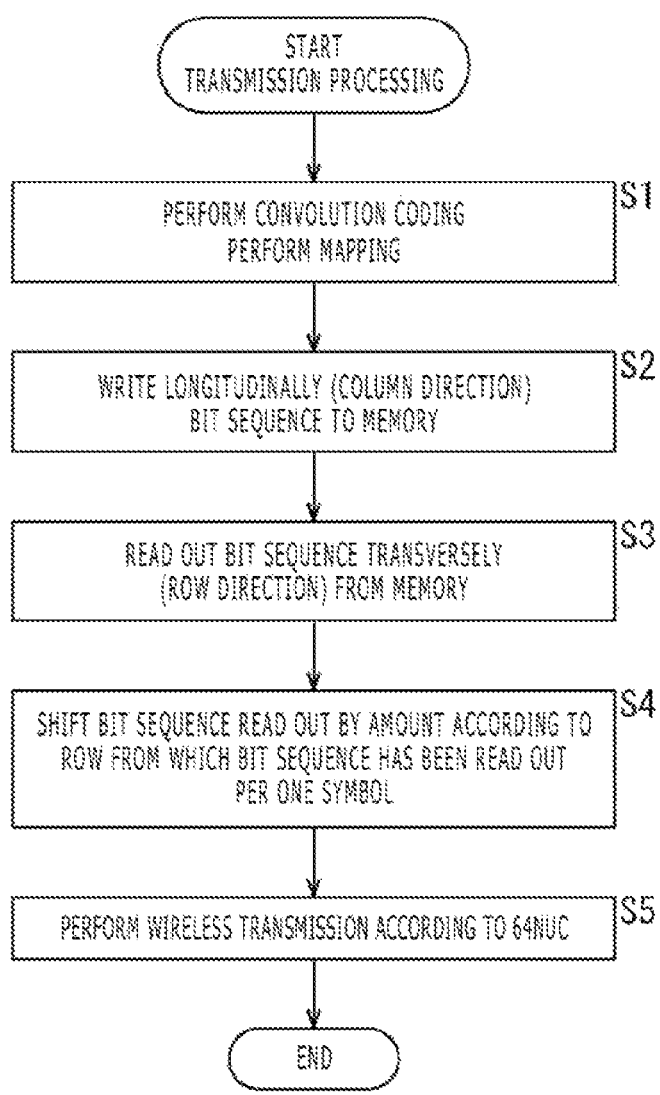
FIG. 9 is a flowchart illustrating transmission processing by the data processing apparatus in FIG. 8.

Next, FIG. 9 is a flowchart illustrating transmission processing by the data processing apparatus 10 having the above-described configuration.

At step S1, the signal input unit 11 acquires a signal of a transmission target and then outputs the signal to the convolution coding unit 12 at the subsequent stage. The convolution coding unit 12 performs convolution coding on the input signal, and then outputs the coded data thus obtained to the mapping unit 13. The mapping unit 13 maps the input coded data to the signal point on the complex plane corresponding to the modulation method employed in the modulation unit 18 at the subsequent stage, and then outputs, to the writing unit 14, the bit sequence representing the signal point (symbol) thus obtained.

At step S2 and step S3, the inter-symbol interleaving is performed. That is, the writing unit 14 writes longitudinally the bit sequence representing the signal point on the complex plane in the storage area of the memory 15. The reading unit 16 reads out transversely the written bit sequence, and then outputs the bit sequence to the shift unit 17.

At step S4, the intra-symbol interleaving is performed. That is, the shift unit 17 shifts the input bit sequence in the symbol per 6 bits of one symbol according to the row of the memory 15 from which the bit sequence has been read out, and then outputs the bit sequence to the modulation unit 18.

At step S5, the modulation unit 18 wirelessly transmits the bit sequence on which the bit interleaving has been performed according to the 64NUC. The descriptions of transmission processing by the data processing apparatus 10 are terminated.

<Comparison of 64QAM and 64NUC>

Figure 1:
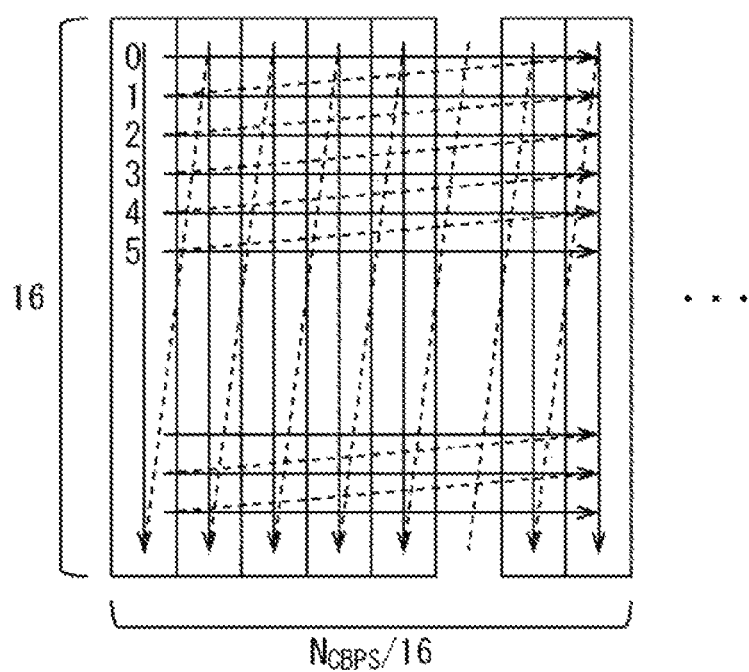
FIG. 1 is a view illustrating an overview of inter-symbol interleaving.
Figure 2:
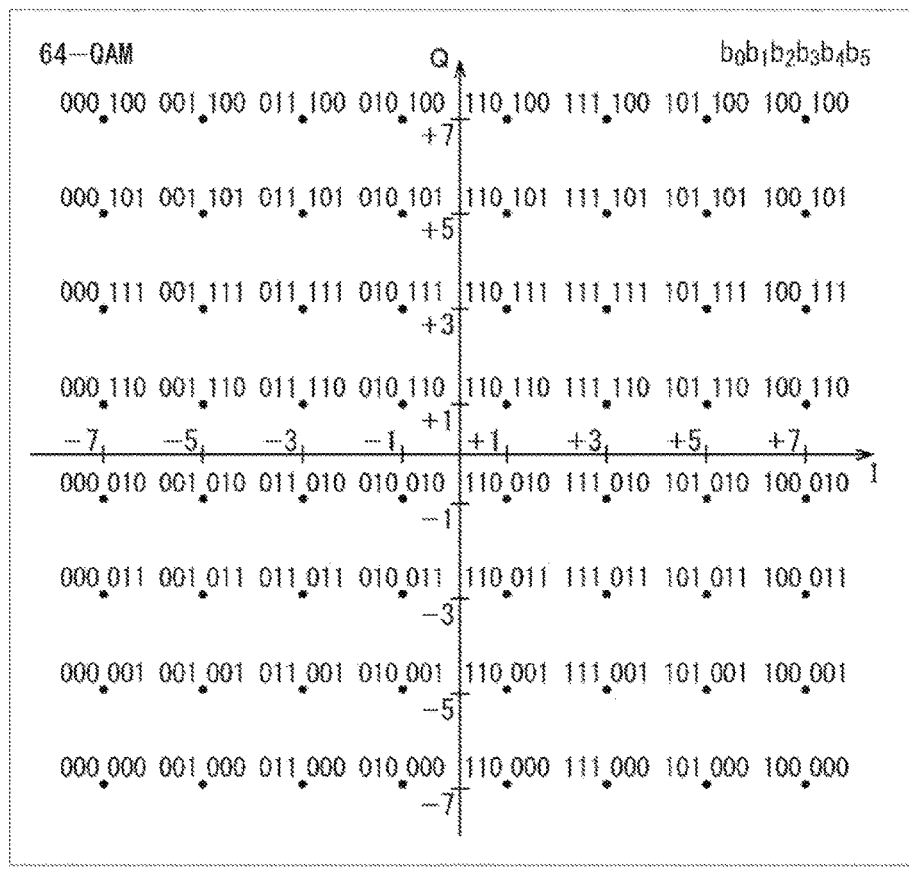
FIG. 2 is a view illustrating a signal space diagram of 64QAM.
Figure 3:
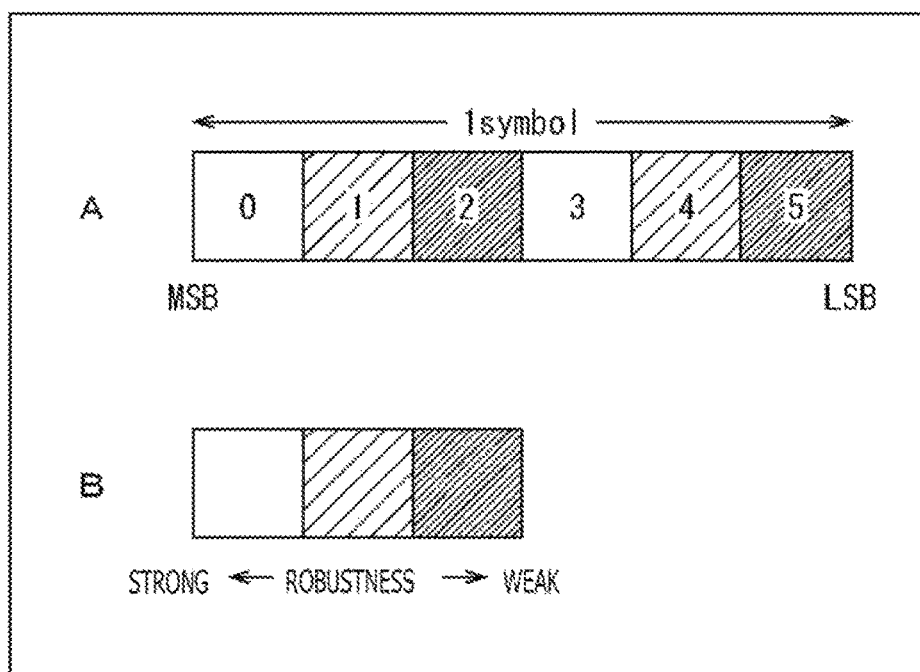
FIG. 3 is a view illustrating robustness of each bit constituting one symbol of 64QAM.
Figure 4:
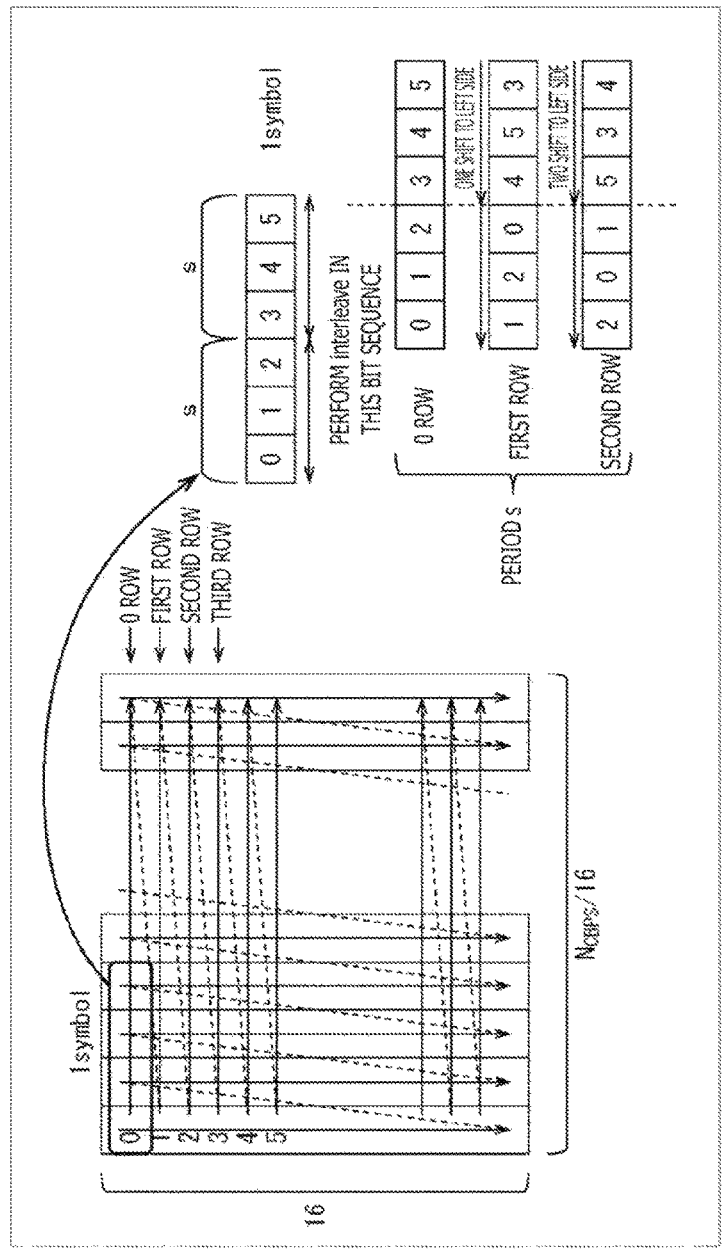
FIG. 4 is a view illustrating an overview of inter-symbol interleaving corresponding to 64QAM.
Figure 10:
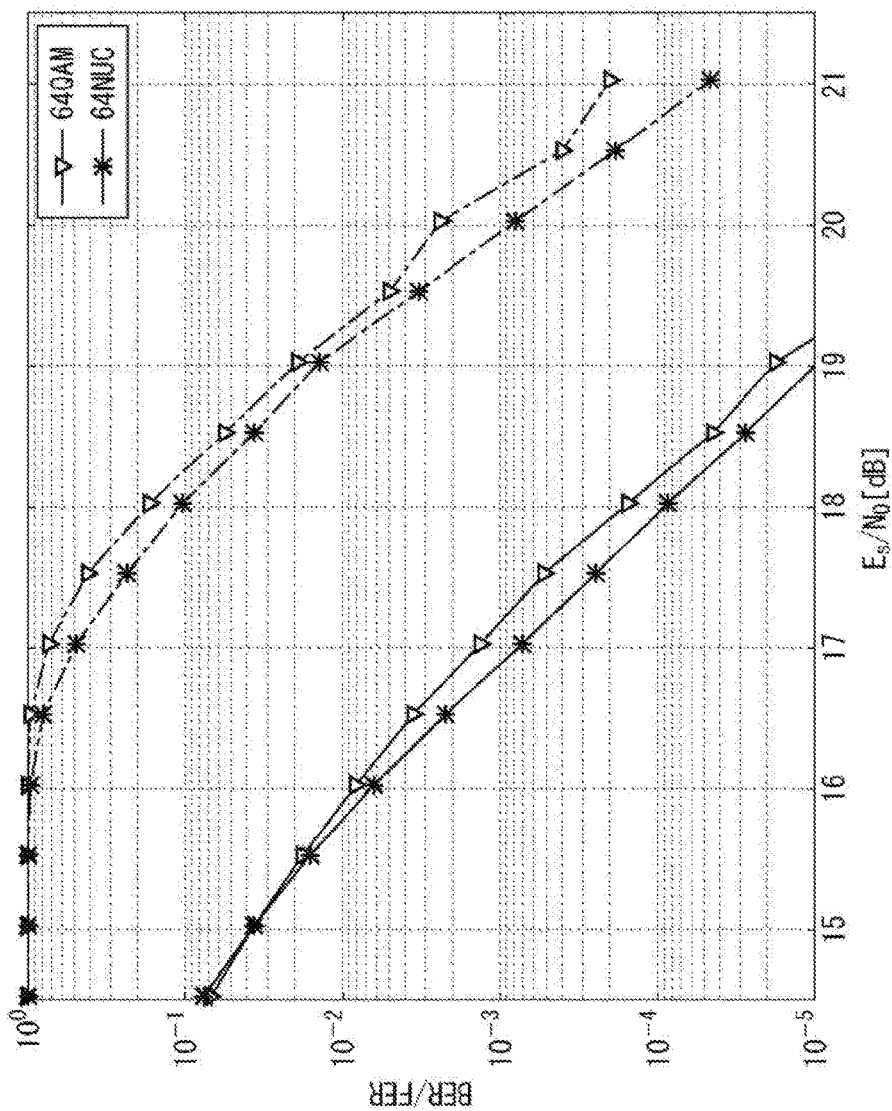
FIG. 10 is a view illustrating a simulation result of each bit error rate of 64QAM and 64NUC.

Next, FIG. 10 illustrates a simulation result of each bit error rate both in a case in which the bit sequence on which the bit interleaving including the intra-symbol interleaving illustrated in FIG. 4 has been performed is wirelessly transmitted according to 64QAM, and in a case in which the bit sequence on which the bit interleaving including the intra-symbol interleaving illustrated in FIG. 7 has been performed is wirelessly transmitted according to 64NUC. Note that the horizontal axis represents the required C/N, and the longitudinal axis represents the error rate.

As clearly illustrated in FIG. 10, it is seen that the bit error rate in 64NUC is always lower than that in 64QAM, that is, it is possible to more efficiently perform the wireless transmission according to 64NUC.

It is to be noted that, in this embodiment, the data processing apparatus 10 employs 64NUC as the modulation method. On the other hand, the present disclosure can be also applied to a case where the other NUC modulation is employed in which the disposition of each signal point on the complex plane is a non-uniform constellation.

By the way, a series of processing of the above-described data processing apparatus 10 can be executed by hardware, and can be executed by software. If the series of processing is executed by the software, the program configuring the software is installed in a computer. Here, the computer includes a computer embedded in a dedicated hardware, and, for example, a general-purpose computer that can execute various types of functions by installing various types of programs, and so forth.

Figure 11:
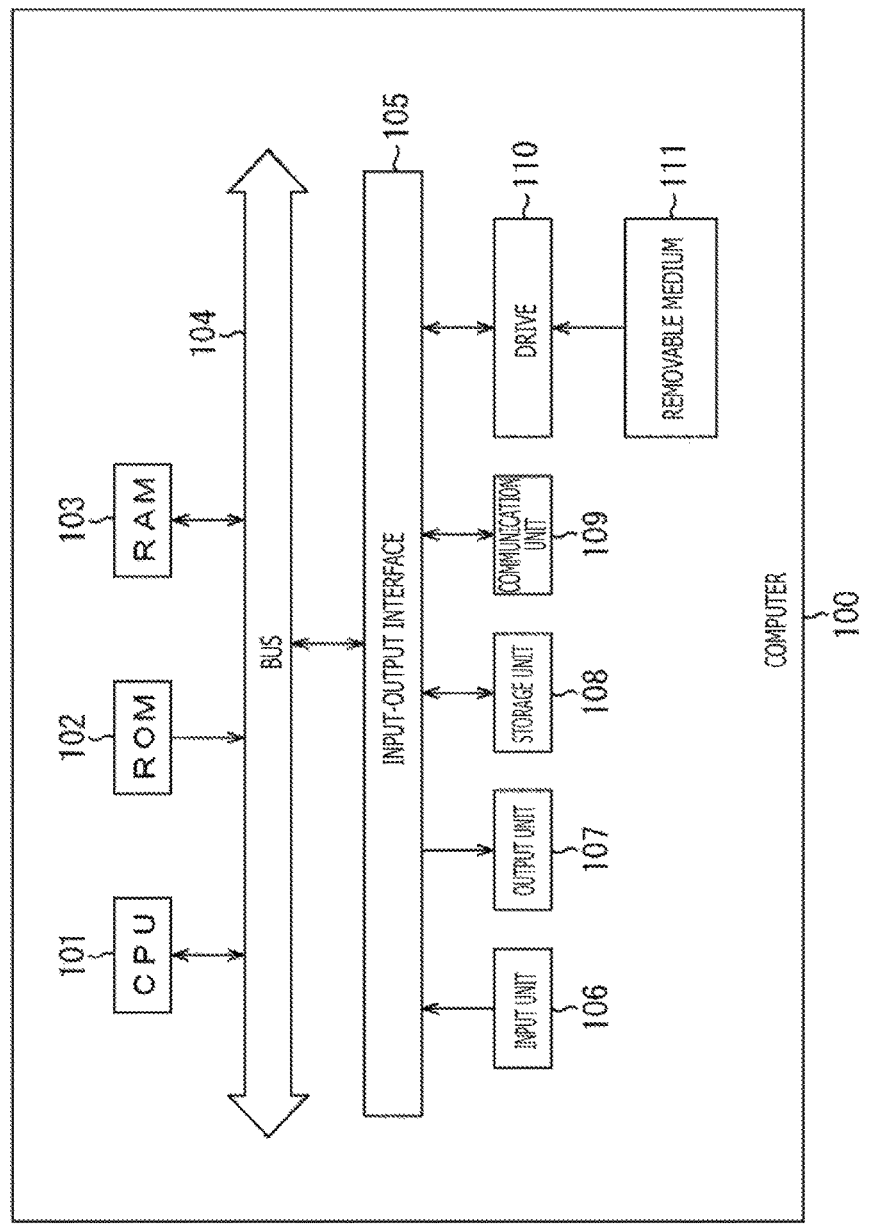
FIG. 11 is a block diagram illustrating a configuration example of a general-purpose computer.

FIG. 11 is a block diagram illustrating a configuration example of hardware of a computer that executes the above-described series of processing by a program.

In a computer 100, a CPU (Central Processing Unit) 101, a ROM (Read Only Memory) 102, and a RAM (Random Access Memory) 103 are interconnected via a bus 104.

An input-output interface 105 is also connected to the bus 104. An input unit 106, an output unit 107, a storage unit 108, a communication unit 109, and a drive 110 are connected to the input-output interface 105.

The input unit 106 includes a keyboard, a mouse, a microphone, and so on. The output unit 107 includes a display, a speaker, and so on. The storage unit 108 includes a hard disk, a non-volatile memory, and so on. The communication unit 109 includes a network interface and so on. The drive 110 drives a removable medium 111 such as a magnetic disk, an optical disk, a magneto-optical disk, or a semiconductor memory, and so on.

In the computer 100 having the configuration described above, the CPU 101 loads, for example, a program stored in the storage unit 108 into the RAM 103 via the input-output interface 105 and the bus 104 and executes the loaded program to perform the series of processing described above.

Note that the program executed by the computer 100 may be a program for performing the processing in time series according to the order described in this specification, or may be a program for performing the processing in parallel or in the timing required when a calling is performed and so on.

Note that the embodiment of the present disclosure is not limited to the above-described embodiment, and various modifications thereto are possible without departing from the subject matter of the present disclosure.

The present disclosure can also adopt the following constitution.

(1)

A data processing apparatus including:

a mapping unit configured to generate a second bit sequence by mapping a first bit sequence to any symbol on a complex plane corresponding to a NUC modulation method;

an inter-symbol interleaving unit configured to generate a third bit sequence by performing inter-symbol interleaving to the second bit sequence;

an intra-symbol interleaving unit configured to generate a fourth bit sequence by performing intra-symbol interleaving for shifting M bits as a whole of the third bit sequence per a same number of M bits as the bit number M representing the symbol; and a modulation unit configured to wirelessly transmit the fourth bit sequence according to the NUC modulation method.

(2)

The data processing apparatus according to (1), in which the inter-symbol interleaving unit generates the third bit sequence by writing vertically the second bit sequence to a memory and reading transversely the second bit sequence from the memory, and the intra-symbol interleaving unit shifts the M bits as a whole of the third bit sequence by a digit according to a row read transversely from the memory per the same number of M bits as the bit number M representing the symbol.

(3)

The data processing apparatus according to (2), in which the intra-symbol interleaving unit shifts 6 bits as a whole of the third bit sequence per the 6 bits by the digit according to the row read transversely from the memory, if the NUC modulation method is 64NUC.

(4)

The data processing apparatus according to any of (1) to (3), further including:

a conversion unit configured to convert a signal of a transmission target into the first bit sequence.

(5)

A method of processing data of a data processing apparatus, including, by the data processing apparatus:

a mapping step of generating a second bit sequence by mapping a first bit sequence to any symbol on a complex plane corresponding to a NUC modulation method;

an inter-symbol interleaving step of generating a third bit sequence by performing inter-symbol interleaving to the second bit sequence;

an intra-symbol interleaving step of generating a fourth bit sequence by performing intra-symbol interleaving for shifting M bits as a whole of the third bit sequence per a same number of M bits as the bit number M representing the symbol; and a modulation step of wirelessly transmitting the fourth bit sequence according to the NUC modulation method.

(6)

A program for causing a computer to function as: a mapping unit configured to generate a second bit sequence by mapping a first bit sequence to any symbol on a complex plane corresponding to a NUC modulation method;

an inter-symbol interleaving unit configured to generate a third bit sequence by performing inter-symbol interleaving to the second bit sequence;

an intra-symbol interleaving unit configured to generate a fourth bit sequence by performing intra-symbol interleaving for shifting M bits as a whole of the third bit sequence per a same number of M bits as the bit number M representing the symbol; and a modulation unit configured to wirelessly transmit the fourth bit sequence according to the NUC modulation method.

REFERENCE SIGNS LIST

10 Data processing apparatus, 11 Signal input unit, 12 Convolution coding unit, 13 Mapping unit, 14 Writing unit, 15 Memory, 16 Reading unit, 17 Shift unit, 18 Modulation unit, 100 Computer, 101 CPU

The invention claimed is:

1. A data processing apparatus comprising:
a processor; and
a memory storing program code executable by the processor to perform operations comprising:
generating a second bit sequence by mapping a first bit sequence to any symbol on a complex plane corresponding to a NUC modulation method;
generating a third bit sequence by performing inter-symbol interleaving to the second bit sequence;
generating a fourth bit sequence by performing intra-symbol interleaving for shifting M bits as a whole of the third bit sequence per a same number of M bits as the bit number M representing the symbol; and
wirelessly transmitting the fourth bit sequence according to the NUC modulation method.

2. The data processing apparatus according to claim 1, wherein
generating the third bit sequence includes writing vertically the second bit sequence to the memory and reading transversely the second bit sequence from the memory, and
generating the fourth bit sequence includes shifting the M bits as a whole of the third bit sequence by a digit according to a row read transversely from the memory per the same number of M bits as the bit number M representing the symbol.

3. The data processing apparatus according to claim 2, wherein the shifting of the fourth bit sequence shifts 6 bits as a whole of the third bit sequence per the 6 bits by the digit according to the row read transversely from the memory, if the NUC modulation method is 64NUC.

4. The data processing apparatus according to claim 1, further comprising:
converting a signal of a transmission target into the first bit sequence.

5. A data processing method, comprising:
generating a second bit sequence by mapping a first bit sequence to any symbol on a complex plane corresponding to a NUC modulation method;
generating a third bit sequence by performing inter-symbol interleaving to the second bit sequence;
generating a fourth bit sequence by performing intra-symbol interleaving for shifting M bits as a whole of the third bit sequence per a same number of M bits as the bit number M representing the symbol; and
wirelessly transmitting the fourth bit sequence according to the NUC modulation method.

6. The data processing method according to claim 5, wherein
generating the third bit sequence includes writing vertically the second bit sequence to a memory and reading transversely the second bit sequence from the memory, and
generating the fourth bit sequence includes shifting the M bits as a whole of the third bit sequence by a digit according to a row read transversely from the memory per the same number of M bits as the bit number M representing the symbol.

7. The data processing method according to claim 6, wherein the shifting of the fourth bit sequence shifts 6 bits as a whole of the third bit sequence per the 6 bits by the digit according to the row read transversely from the memory, if the NUC modulation method is 64NUC.

8. A non-transitory computer readable medium storing program code, the program code being executable by a processor to perform operations comprising:
generating a second bit sequence by mapping a first bit sequence to any symbol on a complex plane corresponding to a NUC modulation method;

generating a third bit sequence by performing inter-symbol interleaving to the second bit sequence;

generating a fourth bit sequence by performing intra-symbol interleaving for shifting M bits as a whole of the third bit sequence per a same number of M bits as the bit number M representing the symbol; and wirelessly transmitting the fourth bit sequence according to the NUC modulation method.

9. The non-transitory computer readable medium according to claim 8, wherein generating the third bit sequence includes writing vertically the second bit sequence to a memory and reading transversely the second bit sequence from the memory, and generating the fourth bit sequence includes shifting the M bits as a whole of the third bit sequence by a digit according to a row read transversely from the memory per the same number of M bits as the bit number M representing the symbol.

10. The non-transitory computer readable medium according to claim 9, wherein the shifting of the fourth bit sequence shifts 6 bits as a whole of the third bit sequence per the 6 bits by the digit according to the row read transversely from the memory, if the NUC modulation method is 64NUC.

* * * * *